United States Patent
Xiang et al.

(10) Patent No.: US 9,046,791 B2
(45) Date of Patent: Jun. 2, 2015

(54) APPARATUSES AND METHODS FOR DETECTING WAVE FRONT ABBERATION OF PROJECTION OBJECTIVE SYSTEM IN PHOTOLITHOGRAPHY MACHINE

(75) Inventors: Yang Xiang, Jilin (CN); Changsong Yu, Jilin (CN)

(73) Assignee: Changchun Institute of Optics, Fine Mechanics and Physics, Chinese Academy of Sciences, Changchun, Jilin (CN)

( * ) Notice: Subject to any disclaimer, the term of this patent is extended or adjusted under 35 U.S.C. 154(b) by 105 days.

(21) Appl. No.: 13/884,028

(22) PCT Filed: Nov. 30, 2011

(86) PCT No.: PCT/CN2011/083216
§ 371 (c)(1),
(2), (4) Date: May 8, 2013

(87) PCT Pub. No.: WO2013/078638
PCT Pub. Date: Jun. 6, 2013

(65) Prior Publication Data
US 2014/0240697 A1   Aug. 28, 2014

(51) Int. Cl.
*G01B 11/02* (2006.01)
*G03F 7/20* (2006.01)
*G02B 5/18* (2006.01)
*G01M 11/02* (2006.01)

(52) U.S. Cl.
CPC .............. *G03F 7/706* (2013.01); *G02B 5/1871* (2013.01); *G01M 11/0271* (2013.01)

(58) Field of Classification Search
CPC ................. G01M 11/0242; G01M 11/0271; G03F 7/706; G02B 5/1866; G02B 5/1871
USPC ................................................. 356/515, 521
See application file for complete search history.

(56) References Cited

U.S. PATENT DOCUMENTS 6,091,486 A  *  7/2000  Kirk ............................. 356/124
7,352,475 B2    4/2008  Hasegawa
(Continued)

FOREIGN PATENT DOCUMENTS

| CN | 1700099 A | 11/2005 |
| CN | 101609266 A | 12/2009 |
| TW | 200831855 A | 8/2008 |

OTHER PUBLICATIONS

International Search Report for corresponding International Patent Application No. PCT/CN2011/083216 mailed Aug. 30, 2012.

*Primary Examiner* — Michael A Lyons
(74) *Attorney, Agent, or Firm* — Merchant & Gould P.C.

(57) ABSTRACT

Apparatus and methods for detecting wave front aberration of a projection objective lens in a photolithography machine are disclosed. The apparatus comprises: a light source system configured to generate an illuminating beam; a spatial filter configured to receive the illuminating beam and generate ideal spherical wave; a splitter plate arranged downstream to the spatial filter at a predetermined angle with respect to an optical axis of the spherical wave and having a transflective film being applied on a surface thereof; the projection objective lens configured to receive a beam from the splitter plate and generate an output beam; a spherical mirror configured to reflect the output beam from the projection objective lens to the projection objective lens, light passing through the projection objective lens being reflected by the splitter plate; and an interferometer configured to receive light reflected by the splitter plate and measure the wave front aberration of the projection objective lens.

10 Claims, 2 Drawing Sheets

(56) References Cited

U.S. PATENT DOCUMENTS

| | | | |
|---|---|---|---|
| 7,408,652 B2 * | 8/2008 | Wegmann et al. | 356/515 |
| 7,768,653 B2 | 8/2010 | Latypov et al. | |
| 2002/0163738 A1 * | 11/2002 | Yoshihara | 359/711 |
| 2008/0062427 A1 | 3/2008 | Ohsaki et al. | |
| 2008/0316448 A1 | 12/2008 | Ohsaki | |
| 2010/0233636 A1 | 9/2010 | Kuramoto | |

* cited by examiner

APPARATUSES AND METHODS FOR DETECTING WAVE FRONT ABBERATION OF PROJECTION OBJECTIVE SYSTEM IN PHOTOLITHOGRAPHY MACHINE

This application is a National Stage Application of PCT/CN2011/083216, filed 30 Nov. 2011, which application is incorporated herein by reference. To the extent appropriate, a claim of priority is made to each of the above disclosed applications.

TECHNICAL FIELD

The present disclosure relates to technical field of optical detection. Apparatus and methods according to the present disclosure are suitable for detection of wavefront aberration of an immersive photolithography projection system. Apparatus and methods according to the present disclosure are also suitable for detection of the wave front aberration of a dry photolithography projection system and measurement of the wave front aberration of lens during an alignment procedure.

BACKGROUND

Photolithography process involves transferring a pattern on a mask onto a photoresist layer applied on a surface of a silicon substrate by means of exposure and then transferring the pattern onto the silicon substrate by processes including development and etching, etc. The photolithography process is a key process in Large-Scale Integrated circuit (LSI) manufacture because it determines feature size of the LSI. A projection lens in a photolithography tool is a key component of the photolithography process.

In recent years, the feature size has been reduced by reducing exposure wavelength, increasing numerical aperture of the projection objective lens, and reducing photolithography process factors continuously. After years of development, the exposure wavelength of the photolithography machine has been reduced from 436 nm (g line), 365 nm (i line), and 248 nm (KrF) to 193 nm (ArF). Currently, the numerical aperture of the projection objective lens in the dry photolithography machine has reached a limit value of 0.93. The numerical aperture of the projection objective lens in the photolithography machine can be increased to more than 1.3 with assistance of immersion technology. The feature size of a chip than can be implemented by the photolithography process goes downward beyond a 45 nm node.

For the immersive photolithography technology, dielectric with high refractive index, which is typically water, is used to replace air between a bottom surface of the projection objective lens in a conventional photolithography machine and a wafer, in order to reduce the wavelength of exposure light source and increase the numerical aperture of the lens, and thereby increase resolution.

The system wave front aberration is a characteristic index for evaluating performance of the projection objective lens in the photolithography machine. Whether the photolithography machine can achieve by exposure a feature line width of several nanometers largely depends upon whether the system wave front aberration of the projection objective lens can be controlled within a range of several nanometers. It is thus desired to develop technologies and equipments for detecting the system wave front aberration with an accuracy of sub-nanometer order, which can measure the system wave front aberration of the projection objective lens precisely. Then the feature line width that can possibly be achieved is evaluated to provide quantified data to be used in directing ultra-precise assembly and adjustment of the protection objective lens.

Currently, apparatus that can be used for detecting the wave front aberration of the projection objective lens system in the photolithography machine includes Point Diffraction Interferometer, Line Diffraction Interferometer, and Lateral Shearing Interferometer, etc.

SUMMARY

Apparatus and methods for detecting wave front aberration of a projection objective system in a photolithography machine are provided for detecting the wave front aberration of the projection objective system in the photolithography machine.

According to an embodiment, an apparatus for detecting wave front aberration of a projection objective lens in a photolithography machine comprises: a light source system configured to generate an illuminating beam; a spatial filter configured to receive the illuminating beam and generate ideal spherical wave; a splitter plate arranged downstream to the spatial filter at a predetermined angle with respect to an optical axis of the spherical wave and having a transflective film being applied on a surface thereof; a projection objective lens configured to receive a beam from the splitter plate and generate an output beam; a spherical mirror configured to reflect the output beam from the projection objective lens to the projection objective lens, light passing through the projection objective lens being reflected by the splitter plate; and an interferometer configured to receive light reflected by the splitter plate and measure the wave front aberration of the projection objective lens.

According to another embodiment, a method for detecting wave front aberration of a projection objective lens in a photolithography machine comprises: generating an illuminating beam; generating ideal spherical wave from the illuminating beam; providing a splitter plate arranged at a predetermined angle with respect to an optical axis of the spherical wave and having a transflective film being applied on a surface thereof; projecting a beam from the splitter plate to the projection objective lens; reflecting an output beam from the projection objective lens to the projection objective lens, and then reflecting light passing through the projection objective lens by the splitter plate; receiving light reflected by the splitter plate and measuring the wave front aberration of the projection objective lens.

According to embodiments of the present invention, the apparatus is suitable for measurement of the wave front aberration of both an immersive photolithography projection objective system and a dry photolithography projection objective system. The apparatus is also suitable for measurement of the wave front aberration of lens during an alignment procedure.

BRIEF DESCRIPTION OF THE DRAWINGS

The above features and advantages of the present invention will become more apparent from the below detailed description with reference to the drawings, wherein.

DETAILED DESCRIPTION OF THE PREFERRED EMBODIMENTS

Next, preferred embodiments of the present invention will be described in detail with reference to the drawings. Throughout the drawings, identical reference signs are used to represent identical or similar components. For purpose of clarity and concision, detailed description of known functions and structures are omitted herein in order not to obscure the subject matter of the present invention.

Figure 1:
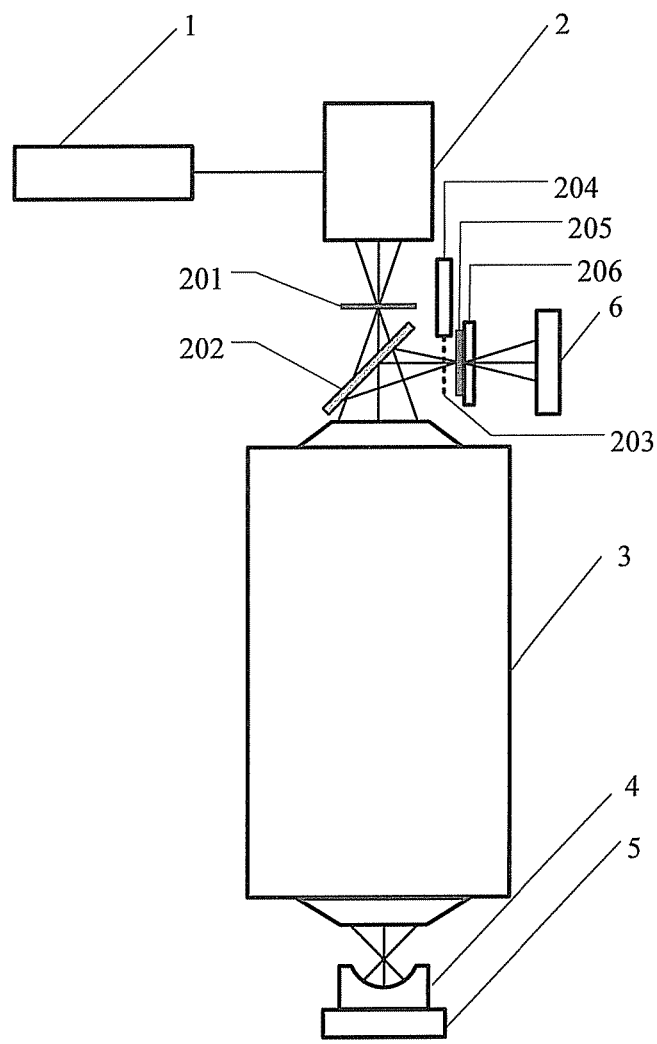
FIG. 1 shows a schematic view of an apparatus for detecting wave front aberration of a projection lens according to the present disclosure.

FIG. 1 shows an apparatus for detecting wave front aberration of an objective lens according to the present disclosure. The apparatus comprises: a light source 1 configured to generate an illuminating beam; an illumination system 2 configured to adjust intensity distribution and illuminating pattern of the light source; a projection lens 3 configured to image a mask pattern; a pinhole spatial filter 201; a splitter plate 202 with a transflective film applied thereon; a spherical mirror 4; a three-dimensional stage base 5 configured to carry the spherical mirror and capable of being positioned precisely; a beam divider device 203; a stage 204 configured to carry the beam divider device and capable of moving precisely; two image-plane spatial filters 205 arranged perpendicular to each other; a stage base 206 configured to carry the spatial filters and capable of being positioned precisely; and an image sensor 6 configured to collect interference patterns.

The light source 1 may be an ArF excimer laser with a wavelength of about 193 nm or a KrF excimer laser with a wavelength of about 248 nm. According to another embodiment, the light source 1 may be a laser device within a visible waveband.

According to an embodiment, the illumination system 2 may comprise a set of expanded beam lens and a beam shaping device, etc. The illumination system 2 may be a conventional illumination system, an annular illumination system, or a secondary illumination system, etc.

Figure 2:
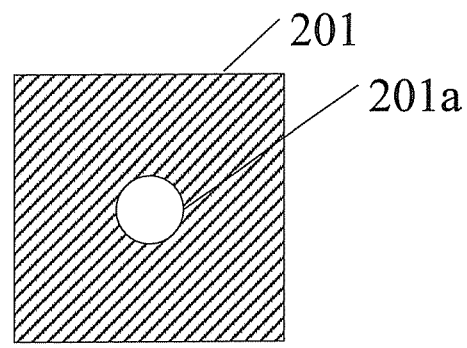
FIG. 2 shows a schematic view of a pinhole spatial filter used in the detection apparatus according to the present disclosure.

As shown in FIG. 2, the pinhole spatial filter 201 is arranged in an object-plane of the optical system to be measured. The pinhole spatial filter 201 has a pinhole 201a configured to generate ideal spherical wave. The pinhole spatial filter 201 may be manufactured by electron-beam exposure or reactive ion beam etching.

The splitter plate 202 may be formed of fused quartz and have a transflective film applied on its light-splitting surface. The splitter plate 202 is positioned at an angle ranging from 30 degrees to 60 degrees, and preferably 45 degrees, with respect to a horizontal direction. The splitter plate 202 should be arranged as close to the projection objective 3 as possible if the measurement is not affected.

The projection objective lens 3 may be a transmissive projection objective lens, a transflective projection objective lens, or a reflective projection objective lens, etc.

The spherical mirror 4 is applied with a high-reflective film. Dielectric between the spherical mirror 4 and the bottom surface of the projection objective lens 3 may be immersive liquid with high refractive index or gas. The three-dimensional stage base 5 is configured to carry the spherical mirror 4 and is capable of being positioned precisely.

Figure 3:
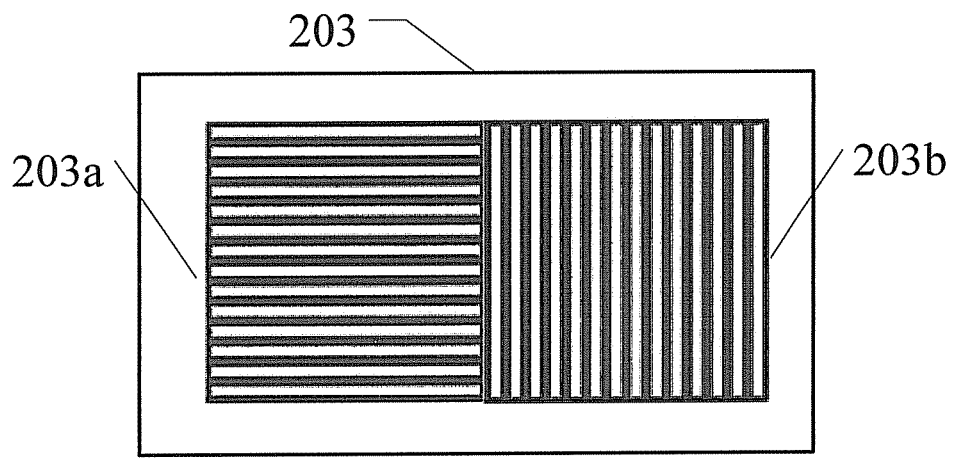
FIG. 3 shows a structural schematic view of a splitter gating used in the detection apparatus according to the present disclosure.

As shown in FIG. 3, the beam divider device 203 may be a binary amplitude gating or a binary phase gating. Two gratings 203a and 203b have orthogonal reticle directions and identical period and duty cycle. The beam divider device 203 is arranged between the splitter 202 and the spatial filters 205.

The stage 204, such as a PZT, can carry the gratings and move in two dimensional directions precisely, so as to introduce regular phase shift in diffractive light from the gratings.

Figure 4:
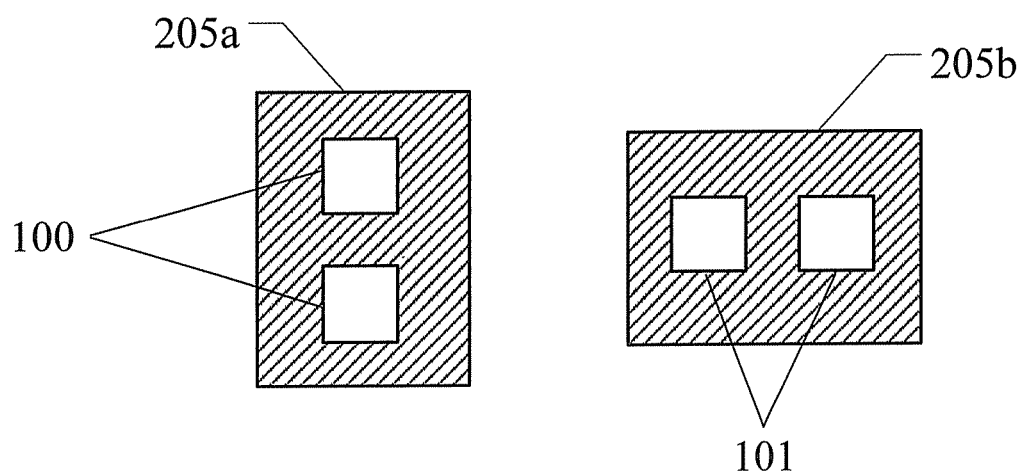
FIG. 4 shows a schematic view of two image-plane spatial filters used in the detection apparatus according to the present disclosure.

As shown in FIG. 4, the spatial filters 205 comprise silicon or fused quartz as a substrate material. An anti-ultraviolet material, such as chromium, nickel, or tantalum, is deposited on the substrate material. Desired rectangular windows 100 and 101 are manufactured by electron beam exposure or reactive ion beam etching. The spatial filters 205 are arranged between the beam divider device 203 and the stage base 206 for the spatial filter. The stage base 206 for the spatial filters can carry the spatial filters 205 and be precisely positioned. The image sensor 6, such as a CCD, is used for imaging the interference pattern.

Referring to FIG. 1, light emitted from the light source 1 is incident on a surface of the pinhole spatial filter 201 via the illuminating system 2. A pinhole 201a generates spherical wave front by diffraction. The pinhole 201a has a diameter d smaller than limit diffraction resolution of the incident beam and satisfying the following equation (1):

$$d \leq \frac{\lambda}{2NA_i} \quad (1)$$

wherein $\lambda$ is wavelength of the light source, $NA_i$ is numerical aperture of the illuminating system at the pinhole spatial filter 201 side. Aberration caused by the illumination system 2 is eliminated by filtering of the spatial filter 201. The ideal spherical wave front generated by the pinhole spatial filter 201 is incident on the splitter plate 202 and then enters the objective lens 3 under measurement.

The splitter plate has the transflective film applied on its light-splitting surface and is positioned at an angle of 45 degrees with respect to the horizontal direction. The splitter plate 202 should be arranged as close to the projection objective 3 as possible if the measurement is not affected. Light exiting from the projection objective lens 3 with aberration information is incident on a center of the spherical mirror 4 having a high-reflective film applied thereon. The dielectric between the spherical mirror 4 and the bottom surface of the projection objective lens 3 may be immersive liquid (e.g., water) with high refractive index or gas (e.g., air). The spherical mirror 4 is carried by the three-dimensional stage base 5 and positioned precisely.

Light reflected from the spherical mirror 4 goes through the projection objective lens 3 and is reflected on the splitting surface of the splitter plate 202. Then the light enters the grating beam divider device 203. The light with the aberration information is diffracted by the binary grating beam divider device 203 to generate ±1 order of diffraction light.

In the embodiment shown in FIG. 1, the wave front aberration is measured by means of shearing interference method. As a result, two measurements in orthogonal directions are required to obtain the system wave front aberration of the projection objective lens 3. Accordingly, the binary grating as the beam divider device 203 comprises two gratings 203a and 203b having orthogonal reticle directions and identical period and duty cycle.

The stage 204 may be a piezoelectric ceramic stage, which can carry the gratings and move in two dimensional directions precisely. Regular phase shift may be introduced between two coherent light beams by driving the gratings along directions perpendicular to respective reticles. The order selection spatial filters 205 are arranged between the beam divider device 203 and the stage base 206 for the spatial filters and as close to the grating beam divider device 203 as possible. Spatial filters 205a and 205b arranged perpendicular to each other comprise two large windows. The windows 100 and 101 have an identical width satisfying the following equation (2):

$$w = \frac{2f\lambda}{NA_i} \qquad (2)$$

wherein $\lambda$ is the wavelength of the light source, $NA_i$ is numerical aperture of an image side of the projection objective lens 3, and f is a spatial frequency of wave front aberration of an exit pupil of the projection objective lens 3.

The spatial filters 205 comprise silicon or fused quartz as the substrate material. The anti-ultraviolet material, such as chromium, nickel, or tantalum, is deposited on the substrate material. The desired rectangular windows are manufactured by electron beam exposure or reactive ion beam etching. The spatial filters are carried by the stage base 206 and precisely positioned, so that the ±1 order of diffraction light goes through respective centers of the rectangular windows 100 and 101.

Due to the order selection spatial filters 205, only the ±1 order of diffraction light can pass the windows of the spatial filters 205. The zero order and higher orders of diffraction light are all blocked by the spatial filters 205. Using the order selection windows as the spatial filters may reduce noise and improve measurement accuracy.

Interference occurs to the ±1 order of diffraction light carrying information of the optical system under measurement and passing through the spatial filters 205. The image sensor 6 collects a plurality of phase-shift interference patterns. A computer is employed to extract phase information from the phase-shift interference pattern and perform phase unwrapping. Two measurements are performed in orthogonal directions. Then phase gradient of the wave front in two orthogonal directions are calculated. Finally, the wave aberration represented by 36 Zernike coefficients are obtained by performing wave front fitting using a differential Zernike polynominal.

The above-described technology inserts the spherical mirror in the light path and can be used in detection of the wave front aberration of the immersive projection objective system and the detection of the wave front aberration of a non-immersive projection objective system.

Also, it is possible to detect the system wave front aberration in a full view field for the projection objective lens, so as to obtain the wave front aberration represented by 36 Zernike coefficients.

Also, the light path structure employing a shearing interferometer has advantages such as high detection accuracy and excellent repeatability.

The spatial filters use large windows to increase system light flux and thus improve signal-to-noise ratio. As a result, contrast ratio of the interference pattern is increased, which improves measurement accuracy consequently.

According to an embodiment of the present invention, an apparatus for detecting wave front aberration of an objective lens according to embodiments of the present invention may comprise: a light source configured to generate an illuminating beam; an illumination system configured to adjust intensity distribution and illuminating pattern of the light source; a pinhole spatial filter configured to filter light from the illumination system to generate ideal spherical wave; a splitter plate with a transflective film applied thereon; a projection objective lens configured to image a mask pattern; a spherical mirror; a beam divider device; a stage configured to carry the beam divider device and capable of moving precisely; two image-plane spatial filters arranged perpendicular to each other; a stage base configured to carry the spatial filters and capable of being positioned precisely; an image sensor configured to collect interference patterns; and a computer configured to store and process data.

According to an embodiment, light emitted from the light source is incident ongoing a surface of the pinhole spatial filter via the illumination system. The pinhole spatial filter generates ideal spherical wave front by diffraction. The ideal spherical wave is incident on the splitter plate and then enters the projection objective lens under measurement. Light emitted from the projection objective lens is incident on the spherical mirror normally. Light reflected from the spherical mirror goes back through the projection objective lens and is reflected on a light-splitting surface of the splitter plate. Then the light enters the grating beam divider device. The light carrying aberration information is diffracted by the grating. The order selection spatial filters are arranged behind the grating and comprise two large windows. Only ±1 order of diffraction light can pass the windows of the spatial filters. Zero order and higher orders of diffraction light are all blocked by the spatial filters. Using the order selection windows as the spatial filters may reduce noise and improve measurement accuracy. Regular phase shift may be introduced between two coherent light beams by driving the gratings along directions perpendicular to respective reticles. Interference occurs to the ±1 order of diffraction light carrying information of wave front aberration of the projection objective lens under measurement and passing through the spatial filters. The image sensor images a plurality of phase-shift interference patterns. The computer is employed to extract phase information from the phase-shift interference pattern and perform phase unwrapping. Two measurements are performed in orthogonal directions. Then phase gradient of the wave front in two orthogonal directions are calculated. Finally, the wave aberration represented by 36 Zernike coefficients are obtained by performing wave front fitting using a differential Zernike polynominal.

The above description is only used to illustrate embodiments of the present invention. Those skilled in the art should understand that any modification or partial substitution without departing from the scope of the present invention will fall in the scope defined by the claims of the present invention. Therefore, the protection scope of the present invention should be defined by the claims.

What is claimed is:
1. An apparatus for detecting wave front aberration of a projection objectNe lens in a photolithography machine, comprising:
   a light source system configured to generate an illuminating beam;
   a spatial filter configured to receive the illuminating beam and to generate an ideal spherical wave;
   a splitter plate arranged downstream to the spatial filter at a predetermined angle with respect to an optical axis of the spherical wave and having a transflective film being applied on a surface thereof;
   a projection objective lens configured to receive a beam from the splitter plate and generate an output beam;
   a spherical mirror configured to reflect the output beam from the projection objective lens to the projection objective lens, light passing through the projection objective lens being reflected by the splitter plate; and an interferometer configured to receive light reflected by the splitter plate and measure the wave front aberration of the projection objective lens, wherein the interferometer comprises:

a beam divider device configured to diffract the light reflected by the splitter plate, the beam divider device being constituted by two one-dimensional binary amplitude gratings or two one-dimensional binary phase gratings having orthogonal reticle directions;

an image-plane spatial filter arranged downstream to the beam divider and having windows allowing predetermined orders of diffraction light;

a data collection unit configured to collect interference patterns of light passing through the windows;

a computer configured to process the collected interference pattern data to obtain the wave front aberration, and a stage configured to carry the two one-dimensional binary amplitude gratings or two one-dimensional binary phase gratings and to move in two dimensional directions precisely.

2. The apparatus according to claim 1, wherein the predetermined angle is in a range of 30 to 60 degrees.

3. The apparatus according to claim 1, wherein the image-plane spatial filter allows +1 order and −1 order of diffraction light to pass through.

4. The apparatus according to claim 1, wherein the projection objective lens is a transmissive projection objective lens, a transflective projection objective lens, or a reflective projection objective lens.

5. The apparatus according to claim 1, wherein there is immersive liquid between a surface of the projection objective lens and the spherical mirror.

6. A method for detecting wave front aberration of a projection objective lens in a photolithography machine, comprising: generating an illuminating beam; generating an ideal spherical wave from the illuminating beam;

providing a splitter plate arranged at a predetermined angle with respect to an optical axis of the spherical wave and having a transflective film being applied on a surface thereof; projecting a beam from the splitter plate to the projection objective lens; reflecting an output beam from the projection objective lens to the projection objective lens, and then reflecting light passing through the projection objective lens by the splitter plate; and receiving light reflected by the splitter plate and measuring the wave front aberration of the projection objective lens, wherein the measuring comprises:

diffracting the light reflected by the splitter plate by a beam divider device, the beam divider device being constituted by two one-dimensional binary amplitude gratings or two one-dimensional binary phase gratings having orthogonal reticle directions;

filtering diffraction light from the beam divider device to allow predetermined orders of diffraction light through windows in an image-plane spatial filter;

collecting interference patterns of light passing through the windows; and processing the collected interference pattern data to obtain the wave front aberration~ wherein the two one-dimensional binary amplitude gratings or two one-dimensional binary phase gratings are moved in two dimensional directions precisely.

7. The method according to claim 6, wherein the predetermined angle is in a range of 30 to 60 degrees.

8. The method according to claim 6, wherein the predetermined order is +1 order and −1 order.

9. The method according to claim 6, wherein the projection objective lens is a transmissive projection objective lens, a transflective projection objective lens, or a reflective projection objective lens.

10. The method according to claim 6, wherein there is immersive liquid between a surface of the projection objective lens and the spherical mirror.

* * * * *